United States Patent
Choi

(10) Patent No.: US 8,106,798 B2
(45) Date of Patent: Jan. 31, 2012

(54) CIRCUIT AND METHOD FOR PARALLEL TO SERIAL CONVERSION

(75) Inventor: Chang-Kyu Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 22 days.

(21) Appl. No.: 12/492,753

(22) Filed: Jun. 26, 2009

(65) Prior Publication Data

US 2010/0289677 A1    Nov. 18, 2010

(30) Foreign Application Priority Data

May 18, 2009   (KR) .................. 10-2009-0043092

(51) Int. Cl.
   *H03M 9/00*    (2006.01)
(52) U.S. Cl. ....................... 341/101; 341/100
(58) Field of Classification Search .......... 341/159, 341/100, 101, 102
   See application file for complete search history.

(56) References Cited

U.S. PATENT DOCUMENTS

| | | | | |
|---|---|---|---|---|
| 5,798,720 A | * | 8/1998 | Yano ............................ | 341/101 |
| 6,437,725 B1 | * | 8/2002 | Kwak et al. .................. | 341/159 |
| 6,611,217 B2 | * | 8/2003 | Buchanan et al. ............ | 341/100 |
| 7,215,263 B2 | * | 5/2007 | Dietrich et al. .............. | 341/101 |
| 2005/0219084 A1 | * | 10/2005 | Dietrich et al. .............. | 341/101 |

FOREIGN PATENT DOCUMENTS

| | | |
|---|---|---|
| KR | 102007009564 | 10/2007 |
| KR | 102008005222 | 6/2008 |

OTHER PUBLICATIONS

Notice of Allowance issued from Korean Intellectual Property Office on Nov. 25, 2010.

* cited by examiner

*Primary Examiner* — Jean Jeanglaude
(74) *Attorney, Agent, or Firm* — IP & T Group LLP

(57) ABSTRACT

A parallel to serial conversion circuit makes output data normally swing even in a high-speed operation. The parallel to serial conversion circuit includes a main selection block configured to drive an output node sequentially in response to data on a first line and data on a second line, and a subsequent selection block configured to drive the output node sequentially in response to data on a subsequent first line and data on a subsequent second line, wherein the output node is driven by inverted data of the data on the subsequent first line and inverted data of the data on the subsequent second line.

20 Claims, 5 Drawing Sheets

CIRCUIT AND METHOD FOR PARALLEL TO SERIAL CONVERSION

CROSS-REFERENCE(S) TO RELATED APPLICATIONS

The present application claims priority of Korean Patent Application No. 10-2009-0043092, filed on May 18, 2009, the disclosure of which is incorporated herein by reference in its entirety.

BACKGROUND OF THE INVENTION

The present invention relates to a circuit for converting data inputted thereto in parallel and outputting serial data.

Although needs for a high-speed semiconductor memory device are gradually increasing, there are physical limitations on an access time of a core region, i.e., a memory cell array region, in the semiconductor memory device. Therefore, the semiconductor memory device internally processes data in parallel and uses a scheme of serializing the data and inputting/outputting serialized data in a high speed when inputting/outputting the data, thereby overcoming the physical limitations of the core region. For the purpose, a parallel to serial conversion circuit is used to convert the data internally processed in parallel to serial data and output the serial data to the outside of the semiconductor memory device.

FIG. 1 illustrates a conventional parallel to serial conversion circuit.

Referring to FIG. 1, the parallel to serial conversion circuit includes a driver constructed of a multiplexer 110 and inverters 121 and 122.

Continuous data are transferred to a first line DATA1 and a second line DATA2 and the multiplexer 110 sequentially selects the data on the first line DATA1 and the data on the second line DATA2, and outputs the selected data in response to a clock CLK. In a period where the clock CLK has a high level, the multiplexer 110 outputs the data on the first line DATA1 to an output node A. On the other hand, in a period where the clock CLK has a low level, the multiplexer 110 outputs the data on the second line DATA2 to the output node A.

FIG. 2 is a timing diagram showing an operation of the conventional parallel to serial conversion circuit described in FIG. 1.

As illustrated in FIG. 2, data D0, D2, D4 and D6 are continuously and sequentially inputted to the first line DATA1 and data D1, D3, D5 and D7 are continuously and sequentially inputted to the second line DATA2. The multiplexer 110 selects the data on the first line DATA1 and outputs the selected data through its output node A in the period where the clock CLK has the high level. On the other hand, the multiplexer 110 selects the data on the second line DATA2 and outputs the selected data through its output node A in the period where the clock CLK has the low level. Therefore, the data on the first and second lines DATA1 and DATA2 are serially arranged and outputted through the output node A in order of D0, D1, D2, D3, D4, D5, D6 and D7.

The parallel data on the first and second lines DATA1 and DATA2 are serially outputted to the output node A of the parallel to serial conversion circuit. Accordingly, the data on the output node A swing in a speed twice larger than that of the data on the first and second lines DATA1 and DATA2. However, in this condition, as a speed of a system employing the parallel to serial conversion circuit increases, the data on the output node A may not swing fully. Thus, there occur problems relating to inter-symbol interference (ISI) such as the increase of a jitter component.

Furthermore, since the multiplexer 110 changes the parallel data to the serial data, there exists the node A where the data inputted through the different lines DATA1 and DATA2 are commonly produced. Since large capacitance is generated at the node A, a swing width of the data on the node A is further limited. As a result, a problem that data having a high frequency cannot swing as it should and thus the data disappear may be generated.

SUMMARY OF THE INVENTION

An embodiment of the present invention is directed to providing technology of making output data of a parallel to serial conversion circuit normally swing even in a high-speed operation.

In accordance with an aspect of the present invention, there is provided a parallel to serial conversion circuit including: a main selection block configured to drive an output node sequentially in response to data on a first line and data on a second line; and a subsequent selection block configured to drive the output node sequentially in response to data on a subsequent first line and data on a subsequent second line, wherein the output node is driven by inverted data of the data on the subsequent first line and inverted data of the data on the subsequent second line.

The data on the first line and the second line as a whole are continuous data, the subsequent first line is configured to transfer the same data as the data on the first line but with a delay compared to that of the data on the first line, and the subsequent second line transfers the same data as the data on the second line but with a delay compared to that of the data on the second line.

is provided a parallel to serial conversion circuit including: a plurality of lines; a plurality of subsequent lines; a main selection block configured to drive an output node sequentially in response to data on the plurality of lines; and a subsequent selection block configured to drive the output node sequentially in response to data on the plurality of subsequent lines, wherein the output node is driven by inverted data of the data on the plurality of subsequent lines.

The data on the plurality of lines are continuous data, and the plurality of subsequent lines transfer the same data as the data on the plurality of lines but with a delay compared to that of the data on the plurality of lines.

In accordance with another aspect of the present invention, there is provided a parallel to serial conversion method including: transferring continuous data to a plurality of lines; transferring the continuous data to a plurality of subsequent lines; sequentially driving the data on the plurality of lines to an output node; and inverting the data on the plurality of subsequent lines and sequentially driving the inverted data to the output node at an output driving strength smaller than that for the data on the plurality of lines.

The plurality of subsequent lines may be configured to transfer the same data as the data on the plurality of lines but with a delay as compared to that of the data on the plurality of lines.

DESCRIPTION OF SPECIFIC EMBODIMENTS

Other objects and advantages of the present invention can be understood by the following description, and become apparent with reference to the embodiments of the present invention.

Figure 1:
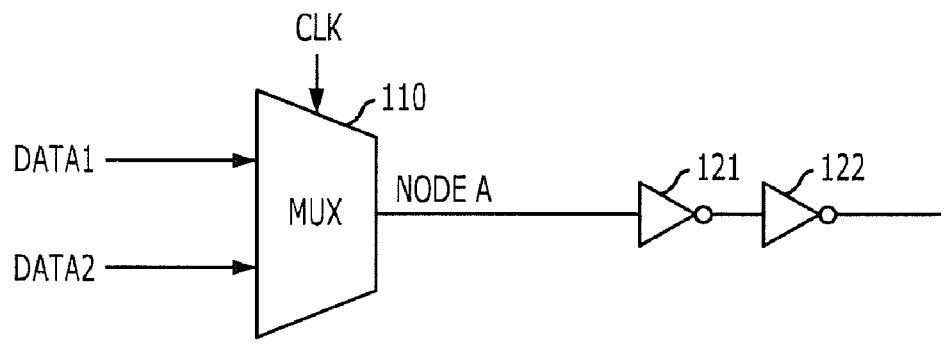
FIG. 1 illustrates a conventional parallel to serial conversion circuit.
Figure 2:
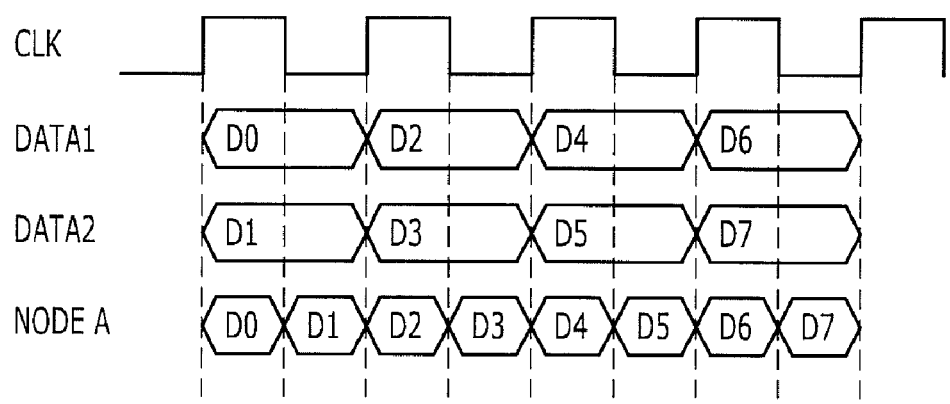
FIG. 2 is a timing diagram showing an operation of the conventional parallel to serial conversion circuit described in FIG. 1.
Figure 3:
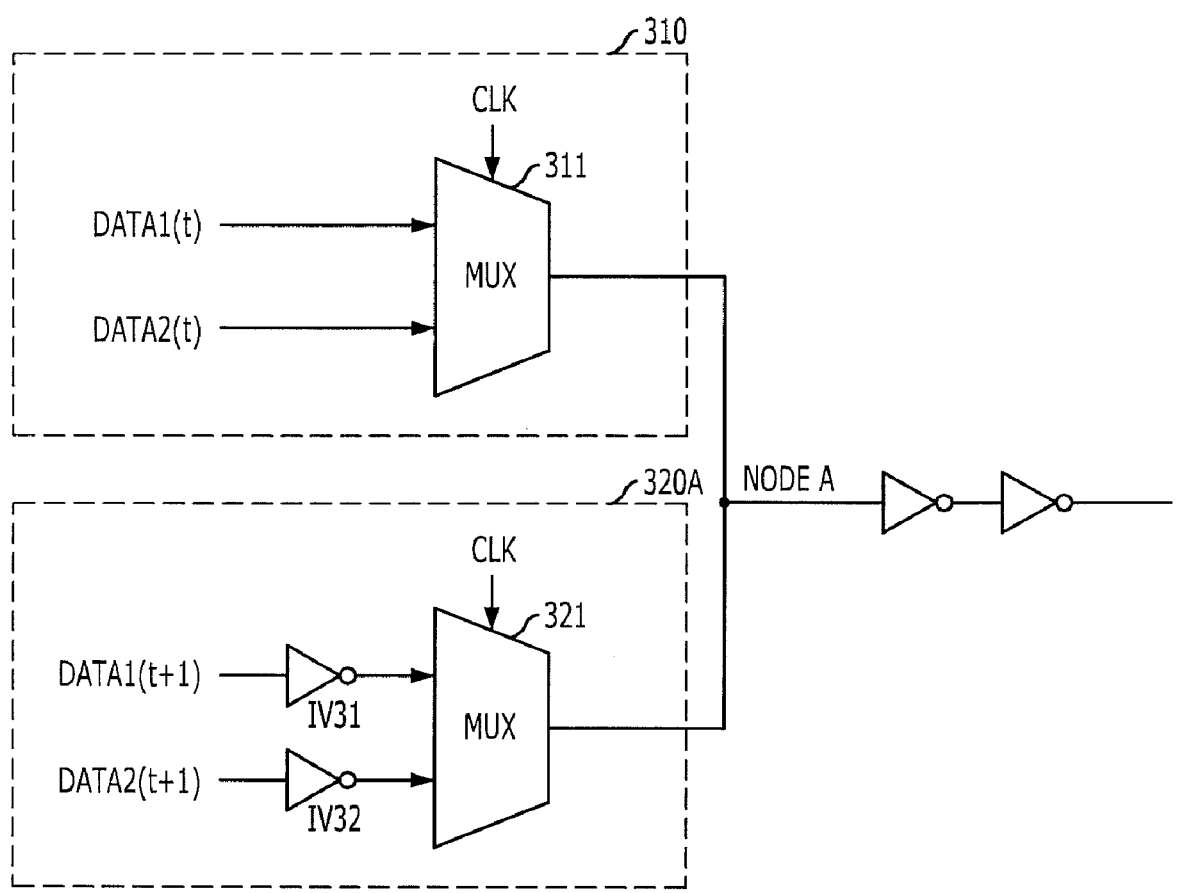
FIG. 3 illustrates a parallel to serial conversion circuit in accordance with a first embodiment of the present invention.

FIG. 3 illustrates a parallel to serial conversion circuit in accordance with a first embodiment of the present invention.

Referring to FIG. 3, the parallel to serial conversion circuit includes a main selection block 310 for driving an output node A sequentially in response to data on a first line DATA1(*t*) and data on a second line DATA2(*t*), and a subsequent selection block 320A for driving the output node A sequentially in response to inverted data of data on a subsequent first line DATA1(*t*+1) and inverted data of data on a subsequent second line DATA2(*t*+1).

The first line DATA1(*t*) and the second line DATA2(*t*) represent lines where continuously transferred data are loaded. The subsequent first line DATA1(*t*+1) represents a line that transfers the same data as first line DATA1(*t*+1) represents a line that transfers the same data as the first line DATA1(*t*) does but transfers the data later than the time the first line DATA1(*t*) does, and the subsequent second line DATA2(*t*+1) represents a line that transfers the same data as the second line DATA2(*t*) does but transfers the data later than the time the second line DATA2(*t*) does. That is, the subsequent first line DATA1(*t*+1) is a line that passes through more delay circuits or shift circuits than the first line DATA1(*t*) does and the subsequent second line DATA2(*t*+1) is a line that passes through more delay circuits or shift circuits than the second line DATA2(*t*) does. In FIG. 3, the subsequent first line DATA1(*t*+1) and the subsequent second line DATA2(*t*+1) are represented with (t+1) to indicate that they transfer data delayed than those of the first line DATA1(*t*) and the second line DATA2(*t*).

The main selection block 310 drives the output node A sequentially in response to the data on the first line DATA1(*t*) and the data on the second line DATA2(*t*). The main selection block 310 may include a multiplexer 311 for sequentially selecting and outputting the data on the first line DATA1(*t*) and the data on the second line DATA2(*t*) in response to a clock CLK. The multiplexer 311 outputs the data on the first line DATA1(*t*) in a period where the clock CLK has a high level and the data on the second line DATA2(*t*) in a period where the clock CLK has a low level. The main selection block 310 is a component corresponding to the conventional parallel to serial conversion circuit.

The subsequent selection block 320A drives the output node A sequentially in response to the inverted data of the data on the subsequent first line DATA1(*t*+1) and the inverted data of the data on the subsequent second line DATA2(*t*+1). The subsequent selection block 320A outputs the inverted data of the data transferred from the subsequent second line DATA2(*t*+1) in the period where the clock CLK has the high level and the inverted data of the data transferred from the subsequent first line DATA1(*t*+1) in the period where the clock CLK has the low level. The subsequent selection block 320A includes a first inverter IV31 for inverting the data on the subsequent first line DATA1(*t*+1), a second inverter IV32 for inverting the data on the subsequent second line DATA2(*t*+1) and a multiplexer 321 for sequentially selecting and outputting data outputted from the first inverter IV31 and data outputted from the second inverter IV32 in response to the clock CLK. Since the subsequent selection block 320A is to assist the main selection block 310 so that the data transition at the output node A is normally achieved, the subsequent selection block 320A may have weaker output driving strength (for example, with a smaller output driving current) than the main selection block 310. Therefore, although the subsequent selection block 320A and the main selection block 310 drive the output node A with signals having logic states opposite to each other, a logic value of a signal on the output node A is determined by the main selection block 310. To make the subsequent selection block 320A have weaker/smaller output driving strength than the main selection block 310, various methods such as a method for designing the inverters IV31 and IV32 to have weak output driving strength or a method for designing the multiplexer 321 to have weak output driving strength may be used.

Figure 4:
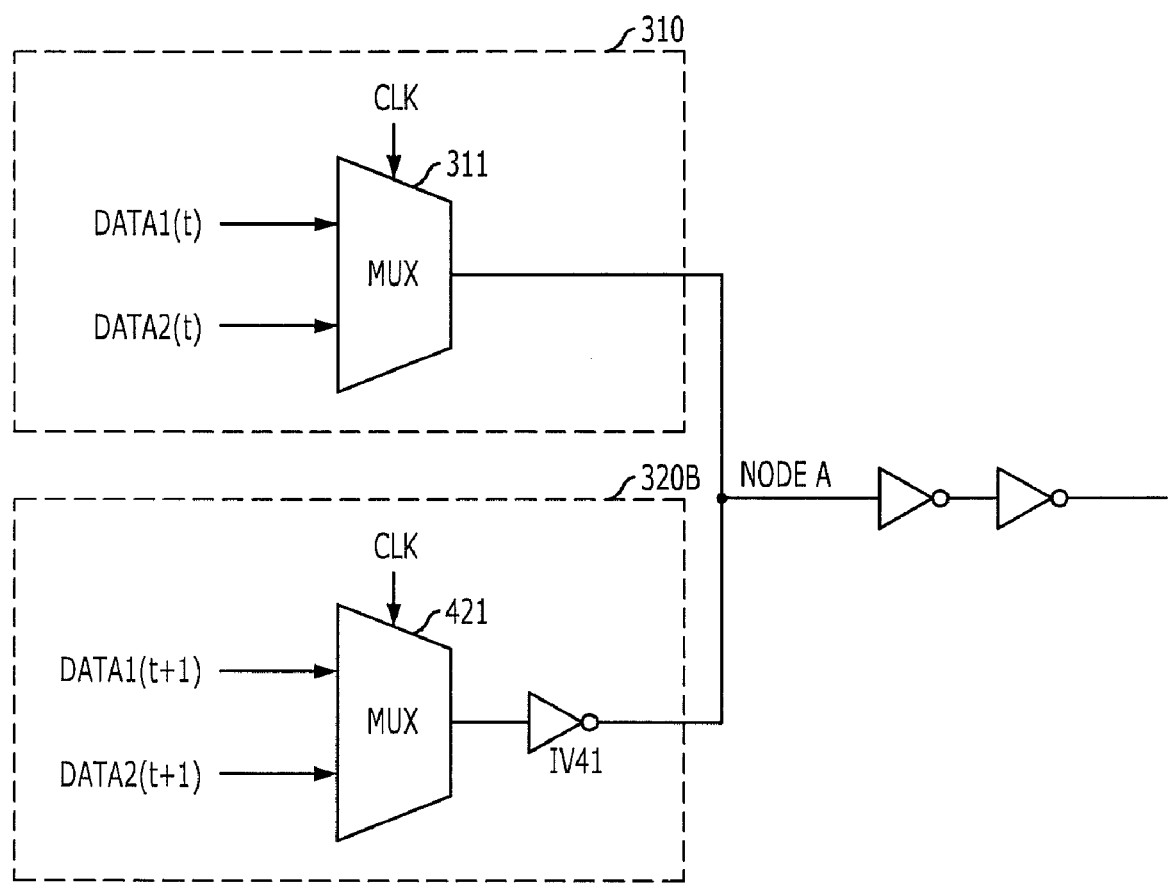
FIG. 4 illustrates a parallel to serial conversion circuit in accordance with a second embodiment of the present invention.

FIG. 4 illustrates a parallel to serial conversion circuit in accordance with a second embodiment of the present invention.

Referring to FIG. 4, the parallel to serial conversion circuit includes a main selection block 310 for driving an output node A sequentially in response to data on a first line DATA1(*t*) and data on a second line DATA2(*t*), and a subsequent selection block 320B for driving the output node A sequentially in response to inverted data of data on a subsequent first line DATA1(*t*+1) and inverted data of data on a subsequent second line DATA2(*t*+1).

Herein, the subsequent selection block 320B illustrated in FIG. 4 is designed to have different construction from the subsequent selection block 320A illustrated in FIG. 3. For instance, the subsequent selection block 320B in FIG. 4 includes a multiplexer 421 for sequentially selecting and outputting the data on the subsequent first line DATA1(*t*+1) and the data on the subsequent second line DATA2(*t*+1) in response to a clock CLK, and an inverter IV41 for inverting output data of the multiplexer 421. That is, FIG. 3 shows that data inverted in advance are inputted to the multiplexer 321, whereas FIG. 4 shows that the output data of the multiplexer 421 are inverted.

The parallel to serial conversion circuit in FIG. 4 performs the same operation as that of the parallel to serial conversion circuit in FIG. 3 except that the internal construction of the subsequent selection block 320B is different from that of the subsequent selection block 320A. Therefore, the detailed description for the parallel to serial conversion circuit in FIG. 4 is omitted herein.

Figure 5:
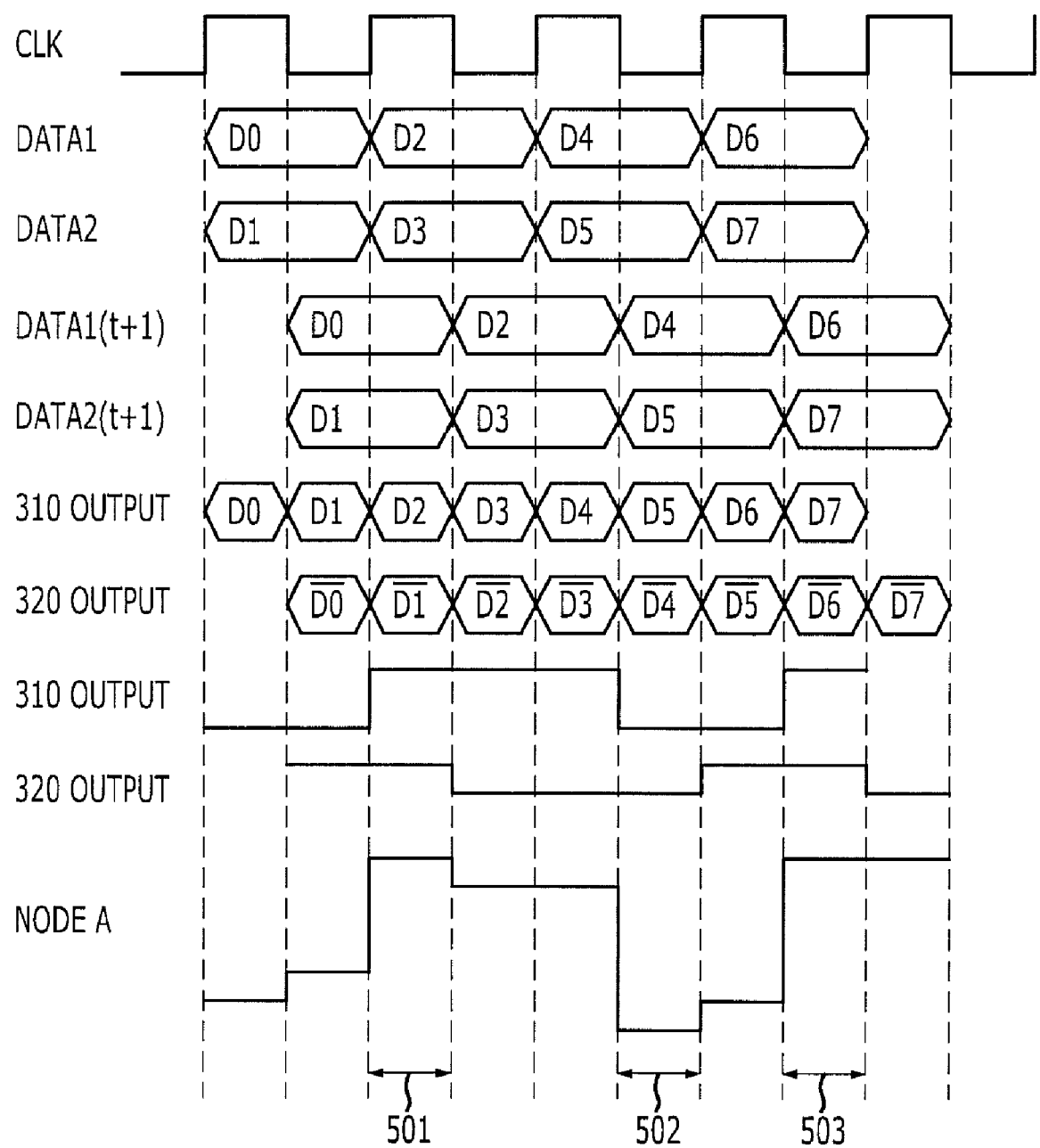
FIG. 5 is a timing diagram showing operations of the parallel to serial conversion circuits described in FIGS. 3 and 4.

FIG. 5 is a timing diagram showing the operations of the parallel to serial conversion circuits described in FIGS. 3 and 4.

Referring to FIG. 5, data are inputted to the first line DATA1(*t*) in order of D0, D2, D4 and D6 and data are inputted to the second line DATA2(*t*) in order of D1, D3, D5 and D7. After a half clock later, data D4 and D6 and data are inputted to the subsequent second line DATA2(*t*+1) in order of D1, D3, D5 and D7.

The data on the first line DATA1(*t*) and the data on the second line DATA2(*t*) are arranged in series and outputted in order of D0, D1, D2, D3, D4, D5, D6 and D7 through an output node of the main selection block 310. The data on the subsequent first line DATA1(*t*+1) and the data on the subsequent second line DATA2(*t*+1) are arranged in series and inverted, and then the inverted data are outputted in order of /D0, /D1, /D2, /D3, /D4, /D5, /D6 and /D7 through an output node of the subsequent selection block 320A or 320B. Herein, the symbol '/' represents an inverted state.

In a lower part of FIG. 5 (310 LOGIC LEVEL & 320 LOGIC LEVEL), logic levels of the output nodes of the main selection block 310 and the subsequent selection block 320A or 320B are described when the data D0, D2, D3, D4, D5, D6 and D7 have a low level, a low level, a high level, a high level, a high level, a low level, a low level and a high level, respectively. It is noted that, since the output driving strength of the main selection block 310 is relatively strong, an output signal thereof swings with a relatively large width, whereas, since the output driving strength of the subsequent selection block 320A or 320B is relatively weak (for example, weaker than the relatively strong driving strength), an output signal thereof swings with a relatively small width (for example, smaller than the relatively large width).

When the output signals of the main selection block 310 and the subsequent selection block 320A or 320B are combined, the output node A shows a waveform described in FIG. 5 (NODE A). It is noted that a basic logic level of the output node A is determined by an output waveform of the output signal of the main selection block 310 and a pre-emphasis operation is performed in periods 501, 502 and 503 where the output signal of the main selection block 310 transits, wherein an output signal on the output node A is more strongly driven in the pre-emphasis operation. Since the pre-emphasis operation is performed on the output node A of the parallel to serial conversion circuit in accordance with the present invention, the foregoing embodiment avoids the problem where data does not swing fully as in the prior art.

Although the output signal is not strongly driven in periods other than the periods 501, 502 and 503, the periods other than the periods 501, 502 and 503 are periods after the transition of the output signal, where the output signal is not required to swing strongly. Therefore, these periods do not affect the operation of the parallel to serial conversion circuit.

Figure 6A:
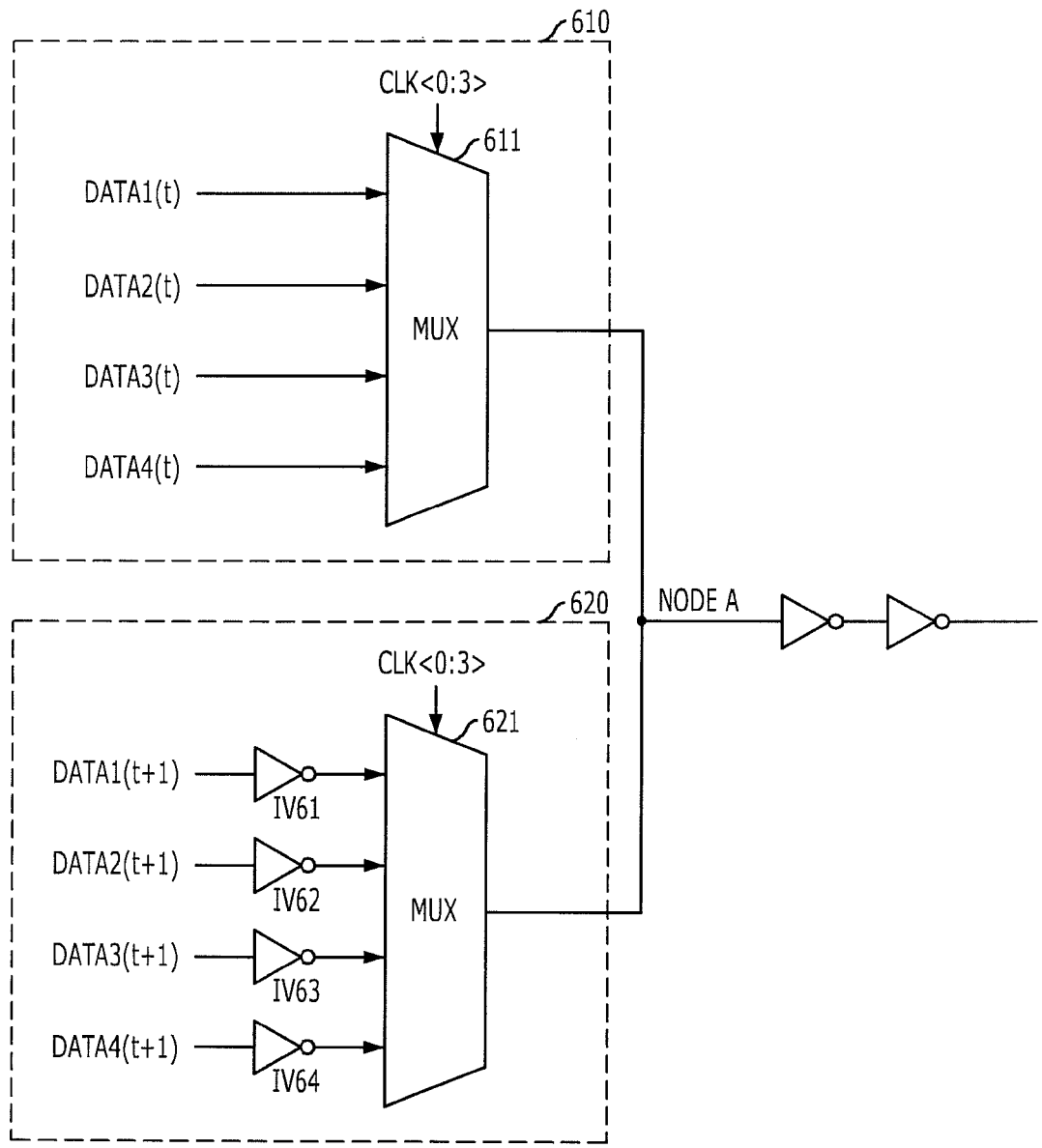
FIG. 6A illustrates a parallel to serial conversion circuit in accordance with a third embodiment of the present invention.

FIG. 6A illustrates a parallel to serial conversion circuit in accordance with a third embodiment of the present invention.

Referring to FIG. 6A, the parallel to serial conversion circuit includes a plurality of lines DATA1(*t*), DATA2(*t*), DATA3(*t*) and DATA4(*t*), a plurality of subsequent lines DATA1(*t*+1), DATA2(*t*+1), DATA3(*t*+1) and DATA4(*t*+1), a main selection block 610 for driving an output node A sequentially in response to data on the plurality of lines DATA1(*t*), DATA2(*t*), DATA3(*t*) and DATA4(*t*), and a subsequent selection block 620 for driving the output node A sequentially in response to inverted data of data on the plurality of subsequent lines DATA1(*t*+1), DATA2(*t*+1), DATA3(*t*+1) and DATA4(*t*+1).

The plurality of lines DATA1(*t*), DATA2(*t*), DATA3(*t*) and DATA4(*t*) represent lines where continuously transferred data are loaded. The represent lines where continuously transferred data are loaded. The plurality of subsequent lines DATA1(*t*+1), DATA2(*t*+1), DATA3(*t*+1) and DATA4(*t*+1) represent lines that transfer the same data as those of the plurality of lines DATA1(*t*), DATA2(*t*), DATA3(*t*) and DATA4(*t*) but transfer the data delayed than those of the plurality of lines DATA1(*t*), DATA2(*t*), DATA3(*t*) and DATA4(*t*).

Figure 6B:
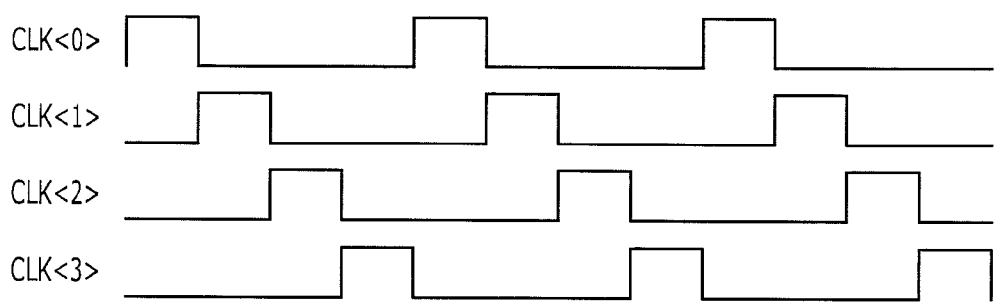
FIG. 6B illustrates clocks used in the parallel to serial conversion circuit described in FIG. 6A.

The main selection block 610 drives the output node A sequentially in response to the data on the plurality of lines DATA1(*t*), DATA2(*t*), DATA3(*t*) and DATA4(*t*). The main selection block 610 may include a multiplexer 611 for sequentially selecting and outputting the data on the plurality of lines DATA1(*t*), DATA2(*t*), DATA3(*t*) and DATA4(*t*) in response to one or more of clocks CLK<0>, CLK<1>, CLK<2> and CLK<3>. Since the clocks CLK<0>, CLK<1>, CLK<2> and CLK<3> have different enabled periods from each other as shown in FIG. 6B, the multiplexer 611 can sequentially select the data on the plurality of lines DATA1(*t*), DATA2(*t*), DATA3(*t*) and DATA4(*t*) using the clocks CLK<0>, CLK<1>, CLK<2> and CLK<3>. It is natural that the number of the clocks CLK<0>, CLK<1>, CLK<2> and CLK<3> can be changed according to the number of the plurality of lines DATA1(*t*), DATA2(*t*), DATA3(*t*) and DATA4(*t*).

The subsequent selection block 620 drives the output node A sequentially in response to the inverted data of the data on the plurality of subsequent lines DATA1(*t*+1), DATA2(*t*+1), DATA3(*t*+1) and DATA4(*t*+1). The subsequent selection block 620 may include a plurality of inverters IV61, IV62, IV63 and IV64 for inverting the data on the plurality of subsequent lines DATA1(*t*+1), DATA2(*t*+1), DATA3(*t*+1) and DATA4(*t*+1), respectively, and a multiplexer 621 for sequentially selecting and outputting data outputted from the plurality of inverters IV61, IV62, IV63 and IV64 in response to one or more of the clocks CLK<0>, CLK<1>, CLK<2> and CLK<3>. Furthermore, as described in FIG. 4, the subsequent selection block 620 may include the construction that the multiplexer 621 directly receives the data on the plurality of subsequent lines DATA1(*t*+1), DATA2(*t*+1), DATA3(*t*+1) and DATA4(*t*+1) and then an output of the multiplexer 621 is inverted using one inverter. The subsequent selection block 620 is for performing the pre-emphasis operation not changing the logic level of the output node A itself. Therefore, the subsequent selection block 620 has weaker output driving strength than the main selection block 610.

Although FIG. 6A illustrates the parallel to serial conversion circuit for serially arranging the data on 4 numbers of lines DATA1(*t*), DATA2(*t*), DATA3(*t*) and DATA4(*t*) and outputting serialized data, the parallel to serial conversion circuit may be designed to serially arrange data on 8 or 16 numbers of lines.

The parallel to serial conversion circuit according to FIG. 6A only has different numbers of lines from the parallel to serial conversion circuit in FIG. 3. Other than that, however, it has the same construction and operations as those of the parallel to serial conversion circuit in FIG. 3. Therefore, the detailed explanation thereof is omitted herein.

Referring back to FIGS. 3 to 6B, a parallel to serial conversion method will be described in detail.

The parallel to serial conversion method includes transferring continuous data to the plurality of lines DATA1(*t*) to DATA4(*t*), transferring the continuous data to the plurality of subsequent lines DATA1(*t*+1) to DATA4(*t*+1), sequentially and strongly driving the data on inverting the data on the plurality of subsequent lines DATA1(*t*+1) to DATA4(*t*+1) and sequentially and weakly driving the inverted data to the output node A.

Although the same data as those on the plurality of lines DATA1(*t*) to DATA4(*t*) are transferred to the plurality of subsequent lines DATA1(*t*+1) to DATA4(*t*+1), the data are transferred to the plurality of subsequent lines DATA1(*t*+1) to DATA4(*t*+1) after being delayed than those on the plurality of lines DATA1(*t*) to DATA4(*t*).

In accordance with the embodiments of the present invention, as the parallel to serial conversion circuit includes the subsequent selection block for inverting and driving the subsequent data, the pre-emphasis operation is performed in the output node of the parallel to serial conversion circuit. Therefore, the output signals of the parallel to serial conversion circuit normally swing and thus it is possible to raise a limiting speed of the parallel to serial conversion circuit.

While the present invention has been described with respect to the specific embodiments, it will be apparent to those skilled in the art that various changes and modifications may be made without departing from the spirit and scope of the invention as defined in the following claims.

What is claimed is:

1. A parallel to serial conversion circuit, comprising:
   a main selection block configured to drive an output node sequentially in response to first data on a first line and second data on a second line; and
   a subsequent selection block configured to receive third data on a subsequent first line, invert the third data, drive the output node in response to the inverted third data, receive fourth data on a subsequent second line, invert the fourth data, and drive the output node in response to the inverted fourth data, wherein the third data is the same data as the first data but is input with a delay on the subsequent first line compared to an input of the first data on the first line and the fourth data is the same data as the second data but is input with a delay on the subsequent second line compared to an input of the second data on the second line.

2. The parallel to serial conversion circuit of claim 1, wherein the first data on the first line and the second data on the second line as a whole are continuous data sequentially output through the parallel conversion circuit.

3. The parallel to serial conversion circuit of claim 2, wherein the main selection block has a larger output driving strength than the subsequent selection block.

4. The parallel to serial conversion circuit of claim 3, wherein the main selection block includes a first multiplexer configured to sequentially select the first data on the first line and the second data on the second line in response to a clock and output the selected data.

5. The parallel to serial conversion circuit of claim 4, wherein the subsequent selection block includes:
   a first inverter for inverting the third data on the subsequent first line to output the inverted third data;
   a second inverter for inverting the fourth data on the subsequent second line to output the inverted fourth data; and
   a second multiplexer for sequentially selecting the inverted third data outputted from the first inverter and inverted fourth data outputted from the second inverter in response to the clock and outputting the selected data.

6. A parallel to serial conversion circuit, comprising:
   a plurality of lines;
   a plurality of subsequent lines;
   a main selection block configured to drive an output node sequentially in response to first data on the plurality of lines; and
   a subsequent selection block configured to receive second data of a plurality of subsequent lines, invert the second data on the plurality of subsequent lines, and drive the output node in response to the inverted second data, wherein the second data on the plurality of subsequent lines is the same data as the first data on the plurality of lines but is input with a delay on the subsequent lines compared to an input of the first data on the plurality of lines.

7. The parallel to serial conversion circuit of claim 6, wherein the first data on the plurality of lines are continuous data sequentially output through the parallel conversion circuit.

8. The parallel to serial conversion circuit of claim 7, wherein the main selection block has a larger output driving strength than the subsequent selection block.

9. The parallel to serial conversion circuit of claim 8, wherein the main selection block includes a first multiplexer configured to sequentially select the first data on the plurality of lines in response to one or more clocks and output the selected data.

10. The parallel to serial conversion circuit of claim 9, wherein the subsequent selection block includes:
    a plurality of inverters for inverting the second data on the plurality of subsequent lines, respectively, to output the inverted second data; and
    a second multiplexer for sequentially selecting the inverted second data outputted from the plurality of inverters in response to the one or more clocks and outputting the selected data.

11. A parallel to serial conversion method, comprising:
    transferring first parallel data to a plurality of lines;
    transferring second parallel data to a plurality of subsequent lines;
    converting the first parallel data to serial data and driving the serialized first parallel data to a common output node; and
    inverting the second parallel data, converting the inverted second parallel data to serial data and driving the inverted and serialized second parallel data to the common output node with a driving strength weaker than that for the serialized first parallel data.

12. The parallel to serial conversion method of claim 11, wherein the plurality of subsequent lines are configured to transfer the same data as the data on the plurality of lines but with a delay as compared to that of the data on the plurality of lines.

13. A parallel to serial conversion method, comprising:
    transferring first data to a plurality of lines;
    transferring second data to a plurality of subsequent lines;
    driving common output node in response to the first data on the plurality of lines; and
    inverting the second data on the plurality of subsequent lines, and additionally driving the common output node in response to the inverted second data on the plurality of subsequent lines, wherein the second data is the same data as the first data but is input with a delay on the subsequent first line compared to an input of the first data on the plurality of lines,
    wherein the additional driving is driven at an output driving strength smaller than that of the driving of the common output node in response to the first data.

14. The parallel to serial conversion method of claim 13, further comprising sequentially selecting the first data on the plurality of lines in response to one or more clocks and output the selected data.

15. A parallel to serial conversion circuit, comprising:
    a main parallel to serial conversion block configured to receive first parallel data on a first line and a second line and output serialized data of the received first parallel data to a common output node; and
    a subsequent parallel to serial conversion block configured to receive second parallel data on a subsequent first line and a subsequent second line and output serialized and inverted data of the received second parallel data to the common output node,
    wherein the second parallel data is data delayed from the first parallel data.

16. The parallel to serial conversion circuit of claim 15, wherein the subsequent parallel to serial conversion block has an output driving strength weaker than that of the main parallel to serial conversion block.

17. The parallel to serial conversion circuit of claim 16, wherein the main parallel to serial conversion block includes a first multiplexer configured to sequentially select the data on the first line and the data on the second line in response to a clock and output the selected data.

18. A parallel to serial conversion circuit, comprising:
a plurality of lines;
a plurality of subsequent lines;
a main parallel to serial conversion block configured to receive first parallel data on the plurality of lines and output serialized data of the received first parallel data to a common output node; and
a subsequent parallel to serial conversion block configured to receive second parallel data on the plurality of subsequent lines and output serialized and inverted data of the second parallel data to the common output node,
wherein the second parallel data is data delayed from the first parallel data.

19. The parallel to serial conversion circuit of claim 18, wherein the subsequent parallel to serial conversion block has an output driving strength weaker than that of the main parallel to serial conversion block.

20. The parallel to serial conversion circuit of claim 19, wherein the main parallel to serial conversion block includes a first multiplexer configured to sequentially select the data on the plurality of lines in response to one or more clocks and output the selected data.

* * * * *

UNITED STATES PATENT AND TRADEMARK OFFICE
CERTIFICATE OF CORRECTION

PATENT NO. : 8,106,798 B2
APPLICATION NO. : 12/492753
DATED : January 31, 2012
INVENTOR(S) : Chang-Kyu Choi Page 1 of 1

It is certified that error appears in the above-identified patent and that said Letters Patent is hereby corrected as shown below:

Title Page, Change FOREIGN PATENT DOCUMENTS portion of Item (56) for References Cited as follows:

FOREIGN PATENT DOCUMENTS

| KR | 1020070095641 | 10/2007 |
| KR | 1020080052227 | 6/2008 |

Signed and Sealed this
Thirteenth Day of March, 2012

David J. Kappos
*Director of the United States Patent and Trademark Office*